(12) United States Patent
Kodama et al.

(10) Patent No.: US 11,589,455 B2
(45) Date of Patent: Feb. 21, 2023

(54) ELECTRONIC MODULE

(71) Applicants: Sumitomo Electric Device Innovations, Inc., Yokohama (JP); Sumitomo Electric Industries, LTD., Osaka (JP)

(72) Inventors: Akitada Kodama, Yokohama (JP); Masato Furukawa, Osaka (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 315 days.

(21) Appl. No.: 16/513,862

(22) Filed: Jul. 17, 2019

(65) Prior Publication Data

US 2020/0029426 A1  Jan. 23, 2020

(30) Foreign Application Priority Data

Jul. 18, 2018 (JP) .............................. JP2018-135392

(51) Int. Cl.
*H05K 1/02* (2006.01)
*H05K 1/18* (2006.01)
(Continued)

(52) U.S. Cl.
CPC ......... *H05K 1/0271* (2013.01); *H05K 1/0306* (2013.01); *H05K 1/142* (2013.01); *H05K 1/181* (2013.01); *H05K 5/03* (2013.01); *H01G 4/1227* (2013.01); *H05K 2201/10015* (2013.01); *H05K 2201/10166* (2013.01); *H05K 2201/10371* (2013.01); *H05K 2201/10522* (2013.01)

(58) Field of Classification Search
CPC .................................................. H05K 1/0271

USPC ......................................................... 428/210
See application file for complete search history.

(56) References Cited

U.S. PATENT DOCUMENTS 6,155,840 A * 12/2000 Sallette .................... G09B 7/02
434/323
8,760,846 B1 * 6/2014 Snyder .................... H01G 11/04
361/326
(Continued)

FOREIGN PATENT DOCUMENTS

JP  H8-111503  4/1996
JP  H11-026897  1/1999
(Continued)

*Primary Examiner* — Stanley Tso
(74) *Attorney, Agent, or Firm* — Smith, Gambrell & Russell, LLP (57) ABSTRACT

The electronic module including a metal base, a ceramic substrate, and a die-capacitor is disclosed. The ceramic substrate is mounted on the metal base via eutectic solder. The ceramic substrate includes a main substrate having a back surface facing the metal base and a front surface opposite to the back surface, and a back metal layer placed on the back surface of the main substrate and joined to the eutectic solder. The die-capacitor is mounted on the front surface of the ceramic substrate along one edge of the ceramic substrate. The back surface of the ceramic substrate is provided with an exposure region where the back metal layer is not provided. The exposure region includes a main region corresponding to an outer shape of the die-capacitor spreading along the front surface and an edge region extending from the main region to the one edge of the ceramic substrate.

18 Claims, 8 Drawing Sheets

(51) Int. Cl.
   *H05K 1/03*   (2006.01)
   *H05K 1/14*   (2006.01)
   *H05K 5/03*   (2006.01)
   *H01G 4/12*    (2006.01)

(56) References Cited

U.S. PATENT DOCUMENTS

| | | | |
|---|---|---|---|
| 2003/0016502 A1 | 1/2003 | Yamada | |
| 2004/0056349 A1 | 3/2004 | Yamada | |
| 2006/0128136 A1* | 6/2006 | Syllaios | B81C 1/00269 |
| | | | 438/613 |
| 2008/0001253 A1* | 1/2008 | Mosley | H01G 4/232 |
| | | | 257/532 |
| 2009/0290398 A1* | 11/2009 | Kanie | H05K 7/1432 |
| | | | 363/132 |
| 2011/0025193 A1* | 2/2011 | Daicho | C09K 11/7734 |
| | | | 313/503 |
| 2013/0248819 A1* | 9/2013 | Aihara | H01L 33/325 |
| | | | 257/13 |
| 2020/0126695 A1* | 4/2020 | Iwamura | H01C 1/14 |
| 2020/0273787 A1* | 8/2020 | Manepalli | H01L 23/49822 |

FOREIGN PATENT DOCUMENTS

| | | |
|---|---|---|
| JP | 2002-344094 | 11/2002 |
| JP | 2006-100640 | 4/2006 |
| JP | 2008-2441137 | 10/2008 |
| JP | 2009-94135 | 4/2009 |

* cited by examiner

ELECTRONIC MODULE

CROSS REFERENCE TO RELATED APPLICATIONS

The present application is based upon and claims the benefit of the priority from Japanese patent application No. 2018-135392, filed on Jul. 18, 2018, which is hereby incorporated by reference in its entirety.

TECHNICAL FIELD

The present disclosure relates to an electronic module.

BACKGROUND

JP2002-344094A discloses a circuit board in which metal layers are placed on both surfaces of a ceramic substrate. To prevent from cracking in the ceramic substrate attributable to the difference between the linear expansion coefficients of the metal layers and the ceramic layer, the circuit board of JP2002-344094A is provided with grooves inside the edge of the board so as to disperse stress. JP2009-094135 also discloses a structure in which recesses for stress alleviation are provided at a conductor pattern.

SUMMARY

The present disclosure provides an electronic module. The electronic module includes a metal base, at least one ceramic substrate, and a die-capacitor. The ceramic substrate is mounted on the metal base via eutectic solder. The ceramic substrate includes a main substrate and a back metal layer. The main substrate has a back surface facing the metal base and a front surface opposite to the back surface. The back metal layer is placed on the back surface of the main substrate and joined to the eutectic solder. The die-capacitor is mounted on the front surface of the ceramic substrate along one edge of the ceramic substrate. In the electronic module, the back surface of the ceramic substrate is provided with an exposure region where the back metal layer is not provided, and the exposure region includes a main region and an edge region. The main region corresponds to an outer shape of the die-capacitor spreading along the front surface and the edge region extends from the main region to the one edge of the ceramic substrate.

BRIEF DESCRIPTION OF THE DRAWINGS

The foregoing and other purposes, aspects and advantages will be better understood from the following detailed description of embodiments of this disclosure with reference to the drawings, in which.

DETAILED DESCRIPTION

Problem to be Solved by the Present Disclosure

In electronic modules used in some fields such as satellites, a ceramic substrate can be mounted on a metal base. In these modules, an electronic component such as a die-capacitor is mounted on a front surface of the ceramic substrate, and a back metal layer for being mounted on the base is provided on a back surface of the ceramic substrate. The back metal layer is a solid electrode and is joined to the base by eutectic solder. Strain is induced in the ceramic substrate due to the difference between the linear expansion coefficients of the base and the ceramic substrate. As a result, stress is applied to the die-capacitor mounted on the ceramic substrate, and then the die-capacitor may undergo cracking.

Advantageous Effect of the Present Disclosure

According to the present disclosure, cracking in the die-capacitor can be prevented.

DESCRIPTION OF THE EMBODIMENTS OF THE PRESENT DISCLOSURE

Embodiments of the present disclosure will be described in detail. An electronic module according to one embodiment of the present disclosure includes a metal base, at least one ceramic substrate, and a die-capacitor. The ceramic substrate is mounted on the metal base via eutectic solder. The ceramic substrate includes a main substrate and a back metal layer. The main substrate has a back surface facing the metal base and a front surface opposite to the back surface. The back metal layer is placed on the back surface of the main substrate and joined to the eutectic solder. The die-capacitor is mounted on the front surface of the ceramic substrate along one edge of the ceramic substrate. In the electronic module, the back surface of the ceramic substrate is provided with an exposure region where the back metal layer is not provided, and the exposure region includes a main region and an edge region. The main region corresponds to an outer shape of the die-capacitor spreading along the front surface and the edge region extends from the main region to the one edge of the ceramic substrate.

In one embodiment, the metal base may include at least one of a copper layer and a molybdenum layer. Alternatively, the metal base may include a first copper layer, a molybdenum layer placed on the first copper layer, and a second copper layer placed on the molybdenum layer, and the first and second copper layers may sandwich the molybdenum layer therebetween. In another embodiment, the ceramic substrate may include an alumina substrate, and the die-capacitor may be mainly formed of barium titanate.

In one embodiment, the ceramic substrate may have a thickness of 0.4±0.05 (mm), and the die-capacitor may be mounted at a distance less than 0.8 (mm) from the edge of the ceramic substrate to an inside of the ceramic substrate. In this embodiment, the die-capacitor may be mounted at a distance at 0.5 (mm) from the edge of the ceramic substrate to an inside of the ceramic substrate.

In one embodiment, the back metal layer may include at least one of titanium, palladium and gold, and the eutectic solder may include gold tin. Alternatively, the back metal layer may include a titanium layer, a palladium layer, and a gold layer, and the eutectic solder may include gold tin.

In one embodiment, the exposure region may further include at least one projection region that projects from the main region toward other edge of the ceramic substrate, other than the one edge. In this embodiment, the projection region may have a triangular shape or a rectangular shape. In another embodiment, the main region may be formed into a square shape and the edge region may be formed into a rectangular shape. The exposure region may be formed into a rectangular shape or a hexagonal shape in whole.

In one embodiment, the electronic module may further include a plurality of ceramic substrates including the ceramic substrate; and a field effect transistor mounted on the metal base between one ceramic substrate and other ceramic substrate of the plurality of ceramic substrates. In another embodiment, the electronic module may further include a plurality of ceramic substrates including the ceramic substrate, wherein the one edge of the ceramic substrate is adjacent to other ceramic substrate placed adjacent to the ceramic substrate.

In one embodiment, the electronic module may further include a package placed on the metal base and surrounding the ceramic substrate therein, and a lid attached to a top of the package to close an opening of the package. In another embodiment, a surface area of the ceramic substrate may be smaller than a surface area of the meal base.

Detailed Description of the Embodiment of the Present Disclosure

Figure 1A:
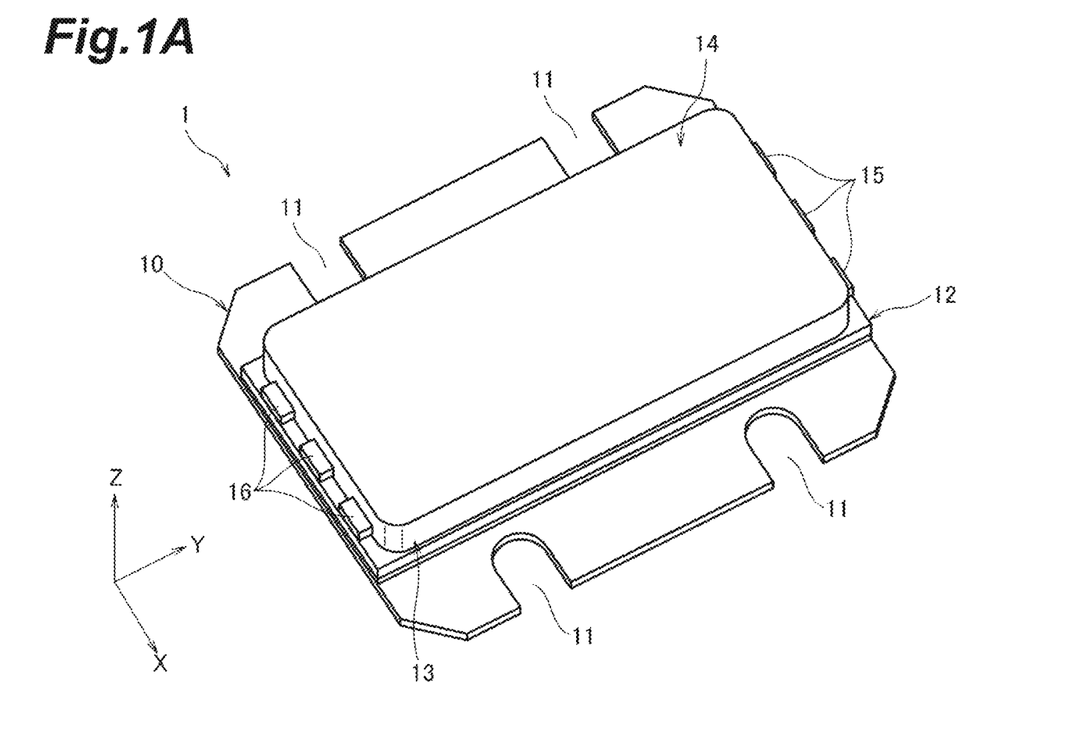
FIGS. 1A and 1B are diagrams illustrating an amplifier module according to an embodiment of the present disclosure.
Figure 1B:
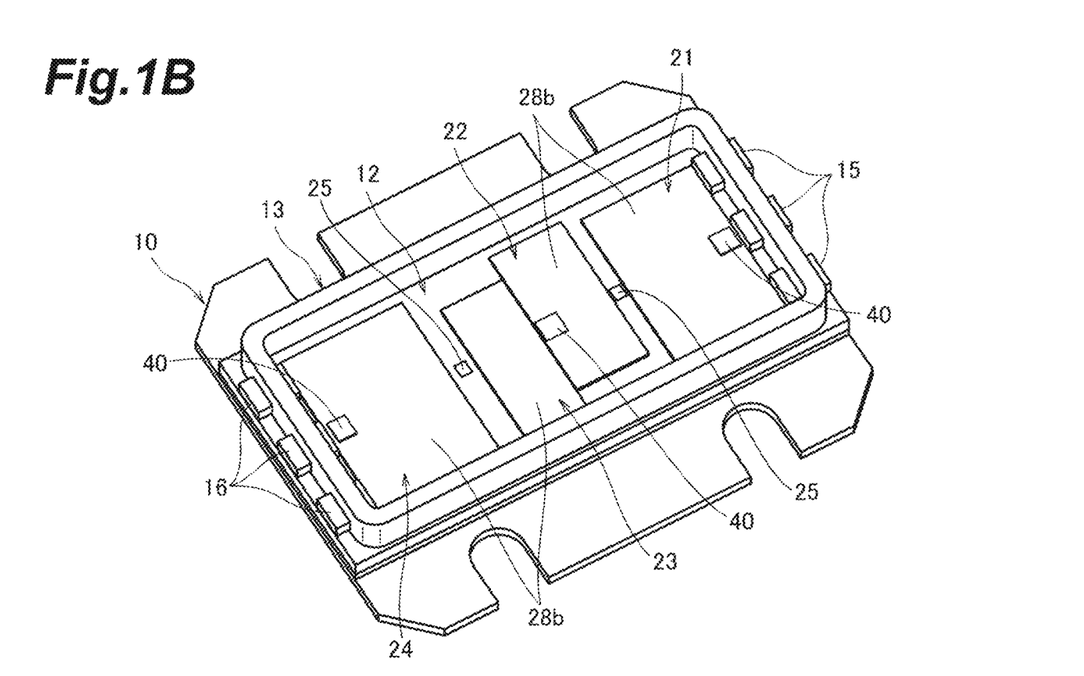

Examples of an electronic module including a mounting structure according to the present disclosure will be described with reference to accompanying drawings. FIGS. 1A and 1B illustrate an amplifier module as an example of the electronic module according to an embodiment of the present disclosure.

An amplifier module 1 is a 2 GHz band electronic module for being mounted on a satellite. As illustrated in FIGS. 1A and 1B, which are external appearance perspective views, the amplifier module 1 includes a first metal base 10, a second metal base 12, a package 13, a lid 14, a plurality of input (In) terminals 15, a plurality of output (Out) terminals 16, a plurality of alumina substrates 21 to 24, a plurality of semiconductor element 25 and a plurality of die-capacitors 40.

The first metal base 10 is made of copper, and is formed in a plate shape having a width (length in the X direction in the drawing) of 20 (mm), a length (length in the Y direction in the drawing) of 25 (mm), and a thickness (length in the Z direction in the drawing) of 0.8 (mm), for example. Four screw fixtures 11 allowing insertion of a fixture screw (not illustrated) are provided at the peripheral edge of the first metal base 10.

Figure 8A:
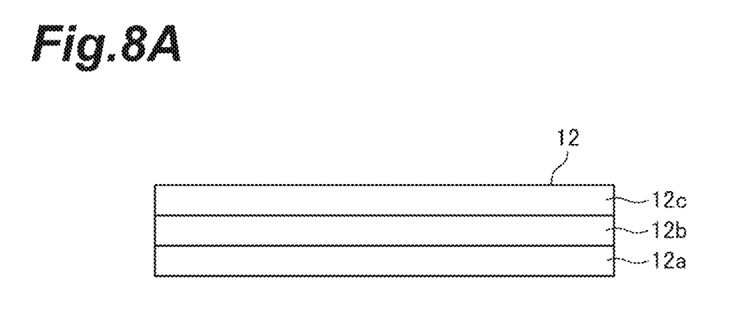
FIG. 8A is a cross-sectional view of a second metal base.

The second metal base 12 is installed on the first metal base 10. The second metal base 12 has a structure in which a copper layer 12a, a molybdenum layer 12b, and a copper layer 12c are stacked in order, as illustrated in FIG. 8A. The second metal base 12 is formed in a plate shape having a width of 11 (mm), a length of 25 (mm), and a thickness of 1.2 (mm), for example. That is, the surface area of the second metal base 12 is smaller than the surface area of the first metal base 10. The In terminals 15 and the Out terminals 16 are installed in end portions of the second metal base 12.

The package 13 is placed and mounted on the second base 12, and surrounds the alumina substrates 21 to 24 therein.

The package 13 is made of metal, such as copper or aluminum. The package 13 has a width of 11 (mm), a length of 25 (mm), and a frame thickness of 1 (mm), for example. The lid 14 having a thickness of 0.4 (mm) is fixed via a wax material to the top of the package 13. The thickness of the entire amplifier module 1, which includes the lid 14, is less than 6 (mm), and is 4.4 (mm), for example.

FIG. 1B schematically illustrates a circuit element mounted inside the package 13 and in which the lid 14 is removed. The first to fourth alumina substrates 21 to 24 are ceramic substrates and mounted on the second base 12, as illustrated in FIG. 1B. The first alumina substrate 21 and the fourth alumina substrate 24 have same configuration each other and each substrate 21, 24 is formed in a plate shape having a width of 8 (mm), a length of 6 (mm), and a thickness of 0.4±0.05 (mm). Each of the alumina substrates 21, 24 includes a predetermined wiring pattern. The first alumina substrate 21 is disposed close to the In terminals 15, and the fourth alumina substrate 24 is disposed close to the Out terminals 16.

The second alumina substrate 22 and the third alumina substrate 23 are disposed between the first alumina substrate 21 and the fourth alumina substrate 24. The second alumina substrate 22 and the third alumina substrate 23 have same configuration each other and each substrate 22, 23 is formed in a plate shape having a width of 8 (mm), a length of 3.5 (mm), and a thickness of 0.4±0.05 (mm). Each of the alumina substrate 22, 23 includes a predetermined wiring pattern. The second alumina substrate 22 is disposed close to the first alumina substrate 21, and the third alumina substrate 23 is disposed close to the fourth alumina substrate 24.

The second alumina substrate 22 is disposed adjacent to the third alumina substrate 23 on the second metal base 12, whereas the second base 12 is exposed between the second alumina substrate 22 and the first alumina substrate 21 and between the third alumina substrate 23 and the fourth alumina substrate 24. The semiconductor elements 25 such as field effect transistors (FETs) are respectively mounted on the exposed areas of the second metal base 12. Accordingly, the illustrated amplifier module 1 constitutes a two-stage amplifier.

Transmission lines of an input/output matching circuit, an inter-stage matching circuit and the like are formed on the first to fourth alumina substrates 21 to 24. Further, as illustrated in FIG. 1B, a die-capacitor 40, also referred to as a parallel plate capacitor, is also mounted on each of the first, second, and fourth alumina substrates 21, 22, and 24. The die-capacitor 40 is formed in a plate shape having a width of 1 (mm), a length of 1 (mm), and a thickness of 0.1 (mm). In the die-capacitor 40, surface and back electrodes made of gold, copper, nickel, or the like are respectively provided on the surface and the back of a high dielectric base material such as barium titanate.

The second alumina substrate 22 will be described as an example. The first alumina substrate 21 and the fourth alumina substrate 24 may have similar configuration as the second alumina substrate 22. As illustrated in FIG. 1B, the die-capacitor 40 is mounted on a front surface 27 of the second alumina substrate 22 along an edge 22a of the second alumina substrate 22 so that a surface electrode of the die-capacitor 40 is connected to the wiring pattern located on the third alumina substrate 23 with the shortest bonding wire (not illustrated). A distance from the edge 22a, which is located adjacent to the third alumina substrate 23 and face the third alumina substrate 23, to the inside of the second alumina substrate 22 along the Y direction is less than 0.8

(mm). The distance from the edge 22a to the second alumina substrate 22 may be 0.5 (mm), for example.

When the amplifier module 1 described above is mounted on satellites, the amplifier module 1 requires performance exhibition under an environment worse than a ground environment, and also requires an extremely high level of reliability because the amplifier module 1 cannot be replaced subsequent to satellite launch. Specifically, 500 cycles of a temperature cycle test at −55° C. to 125° C. must be satisfied with a product used for satellites. However, a general amplifier module including a die-capacitor 40 mounted on an alumina substrate sometimes cracked in 100 cycles of the temperature cycle test.

Figure 2A:
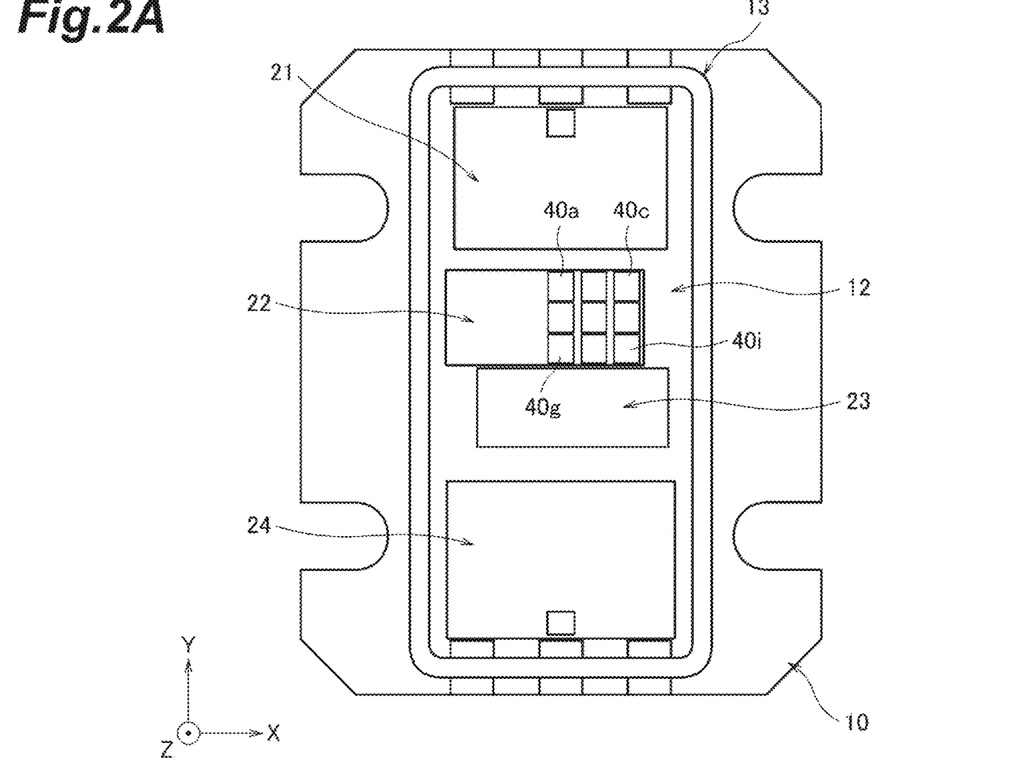
FIGS. 2A and 2B are diagrams illustrating a model for stress analysis.
Figure 2B:
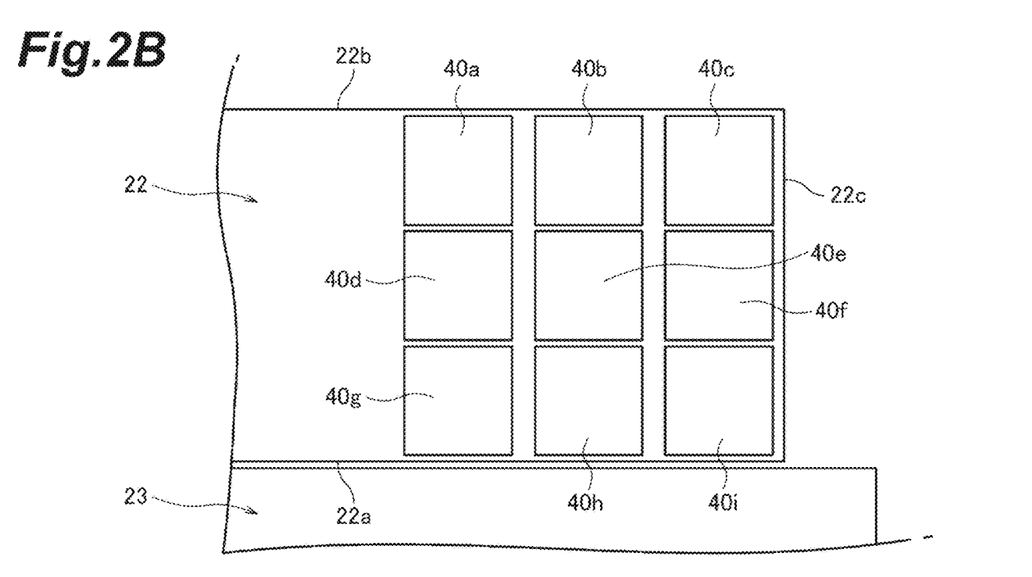

In this regard, stress analysis was conducted with a model in which nine (3×3) die-capacitors 40a to 40i were mounted on the second alumina substrate 22. FIGS. 2A and 2B are diagrams illustrating the model for the stress analysis.

As illustrated in FIG. 2A, the second alumina substrate 22 was mounted on the second metal base 12, and the back of the second alumina substrate 22 was formed from only a solid ground electrode. As illustrated in FIG. 2B, nine places on the surface of the second alumina substrate 22 were installation positions for the die-capacitor of 40a to 40i. The stress analysis was conducted with regard to each of the nine positions at which the nine die-capacitors 40a to 40i respectively installed.

The die-capacitors 40g, 40h, and 40i were disposed adjacent to the third alumina substrate 23 along the X direction in the drawing and along one edge 22a of the second alumina substrate 22. The die-capacitors 40a, 40b, and 40c were disposed along the X direction in the drawing and along another edge 22b opposite to the edge 22a of the second alumina substrate 22. The die-capacitors 40d and 40e were disposed along the X direction in the drawing. The die-capacitors 40d and 40e were respectively disposed between the die-capacitor 40a and the die-capacitor 40g and between the die-capacitor 40b and the die-capacitor 40h. The die-capacitors 40d and 40e were not disposed along the edge 22a, the edge 22b and other edges of the second alumina substrate 22. The die-capacitors 40c, 40f, and 40i are disposed along the Y direction in the drawing and along the edge 20c of the second alumina substrate 22.

The stress analysis was conducted by a heat cycle test at −55° C. to 125° C. It is known that the Young's modulus and the linear expansion coefficient of the copper constituting the second metal base 12 are $1.14 \times 10$ (MPa) and $6.7 \times 10^{-6}$ (/K), the Young's modulus and the linear expansion coefficient of the molybdenum are $3.20 \times 10^5$ (MPa) and $4.9 \times 10^{-6}$ (/K), the Young's modulus and the linear expansion coefficient of the alumina constituting the second alumina substrate 22 are $2.80 \times 10^5$ (MPa) and $7.0 \times 10^{-6}$ (/K), and the Young's modulus and the linear expansion coefficient of the barium titanate constituting the die-capacitors 40a to 40i are $1 \times 10^5$ (MPa) and $11 \times 10^{-6}$ (/K).

Figure 3:
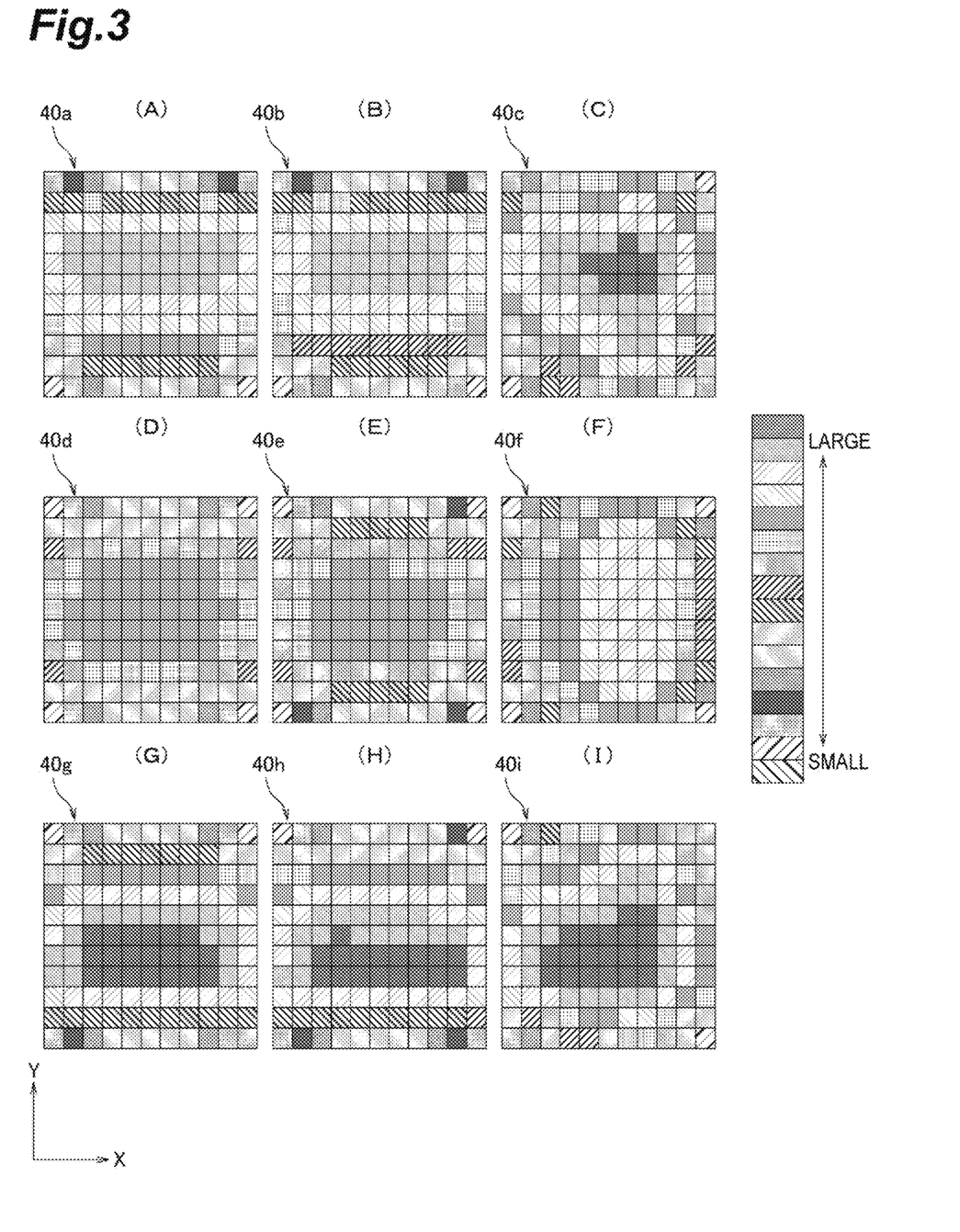
FIG. 3 is a diagram illustrating stress analysis results.

FIG. 3 is a diagram illustrating the results of the stress analysis and illustrates the distribution of the stress applied to the die-capacitors 40a to 40i. For a detailed examination of the stress applied to each of the die-capacitors 40a to 40i, each die-capacitor was divided into 11×11 blocks and each block was displayed by 16 stages ranging from 0 (MPa) to 45 (MPa). It was understood as a result that a large stress was accumulated adjacent to the edges 22a, 22b, 22c of the second alumina substrate 22 in directions that are along the edges.

Specifically, the maximum value of the stress caused in the die-capacitor 40d of (D) portion of FIG. 3 is 33.70 (MPa). The maximum value of the stress caused in the die-capacitor 40e of (E) portion of FIG. 3 is 32.91 (MPa). No large stress remains at the middle position of the second alumina substrate 22.

In contrast, the maximum value of the stress caused in the die-capacitor 40a of (A) portion of FIG. 3 is 41.31 (MPa). The maximum value of the stress caused in the die-capacitor 40b of (B) portion of FIG. 3 is 41.06 (MPa). The maximum value of the stress caused in the die-capacitor 40f of (F) portion of FIG. 3 is 39.08 (MPa). The maximum value of the stress caused in the die-capacitor 40g of (G) of FIG. 3 is 43.36 (MPa). The maximum value of the stress caused in the die-capacitor 40h of (H) portion of FIG. 3 is 43.12 (MPa). Stresses larger compared to the middle position of the second alumina substrate 22 remain in die-capacitors 40a, 40b, 40f, 40g, and 40h.

Further, as illustrated in the respective stress distribution charts of the die-capacitor 40a of (A) portion of FIG. 3, the die-capacitor 40b of (B) portion of FIG. 3, the die-capacitor 40g of (G) portion of FIG. 3, and the die-capacitor 40h of (H) portion of FIG. 3, a large stress remains in a direction, which is X direction, that is along the edges 22a, 22b of the second alumina substrate 22 and no large stress remains in a direction, which is Y direction, that is perpendicular to the edges 22a, 22b. As illustrated in the stress distribution chart of the die-capacitor 40f of (F) portion of FIG. 3, a large stress remains in a direction, which is Y direction, that is along the edge 22c of the second alumina substrate 22 and no large stress remains in a direction, which is X direction, that is perpendicular to the edge. Please be noted that no large stress remains in the outermost periphery of each stress distribution chart and a large stress remains at a position inside the outermost periphery.

The maximum value of the stress caused in the die-capacitor 40c of (C) portion of FIG. 3 is 42.89 (MPa). The maximum value of the stress caused in the die-capacitor 40i of (I) portion of FIG. 3 is 44.48 (MPa). In the die-capacitor 40c of (C) portion FIG. 3 and the die-capacitor 40i of (I) portion of FIG. 3, large stresses remain in the two directions (both the X direction and the Y direction in the drawing) along the edges 22a, 22b and the edge 22c of the second alumina substrate 22, and the largest stresses remains at the corner parts of the second alumina substrate 22. In this manner, large-stress portions appear in the die-capacitors 40a, 40b, 40c, 40f, 40g. 40h, and 40i disposed along the edges 22a, 22b and the edge 22c of the second alumina substrate 22.

That reason can be described as follows. The die-capacitors 40a to 40i (strictly speaking, barium titanate as the main material of the die-capacitors 40a to 40i) have a linear expansion coefficient larger than the linear expansion coefficient of the second alumina substrate 22. Thus, at a low temperature, the second alumina substrate 22 hinders contraction of the die-capacitors 40a to 40i and a tensile stress is caused in the die-capacitors 40a to 40i. Given the relationship in the linear expansion coefficient between the second alumina substrate 22 and the second metal base 12, the second metal base 12 compresses the second alumina substrate 22, and the compressive force is also transmitted to the die-capacitors 40a to 40i via the second alumina substrate 22. Accordingly, a tensile stress caused in the die-capacitors 40d and 40e, disposed at the middle position of the second alumina substrate 22, is small.

However, the second alumina substrate 22 can be freely deformed to one side at the edge parts of the second alumina substrate 22. As a result of the deformation, the compressive force of the second metal base 12 is released and the compressive force is not transmitted to the die-capacitors

40a, 40b, 40c, 40 f, 40g, 40h, and 40i. Accordingly, a large tensile stress may be caused in the die-capacitors 40a, 40b, 40c, 40f, 40g, 40h, and 40i, disposed along the edge parts of the second alumina substrate 22, and crack the die-capacitors. Actually, this analysis supports a result that chip breakage failure is caused in the heat cycle test of the die-capacitor 40 mounted along the edge part of the second alumina substrate 22 in the amplifier module. Likewise, even in a case where electronic components (C, R, and L) are mounted by a method with a small stress absorption effect such as soldering, the electronic components may be destructed from the same mechanism.

The difference between the linear expansion coefficients of the second metal base 12 and the second alumina substrate 22 may cause cracking of the die-capacitor 40 as described above. For this reason, an exposure portion 30 (see FIGS. 4A and 4B) is provided in the amplifier module 1 of this embodiment for alleviation of the stress accumulated in the edge portions of the second alumina substrate 22. In this regard, the stress (average stress) applied to the die-capacitor with respect to a predetermined set temperature (20° C. to 55° C., temperature difference 35° C.) was estimated.

The second alumina substrate 22 will be described as an example similarly to the above. First, in a reference example in which the back of the second alumina substrate 22 is formed from only a solid electrode and no exposure portion is provided, an average stress caused in the die-capacitor was 36.88 (MPa).

Figure 4A:
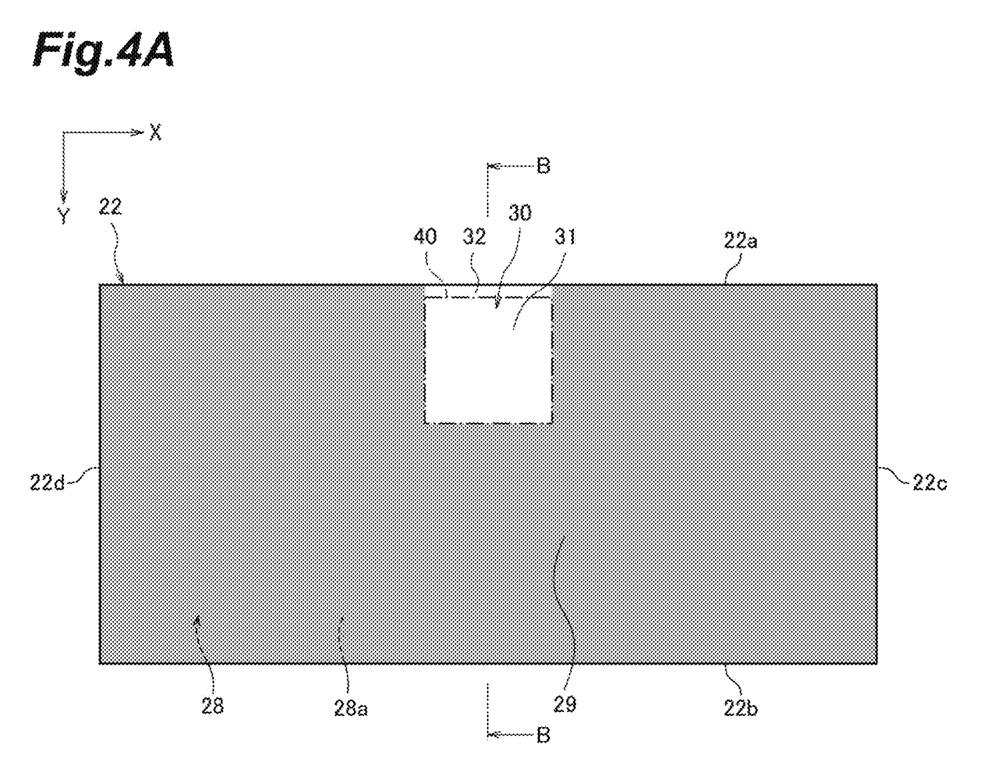
FIG. 4A is a diagram illustrating a ceramic substrate in a first example viewed from a back side thereof and FIG. 4B is a cross-sectional view of the ceramic substrate taken along line B-B in FIG. 4A.
Figure 4B:
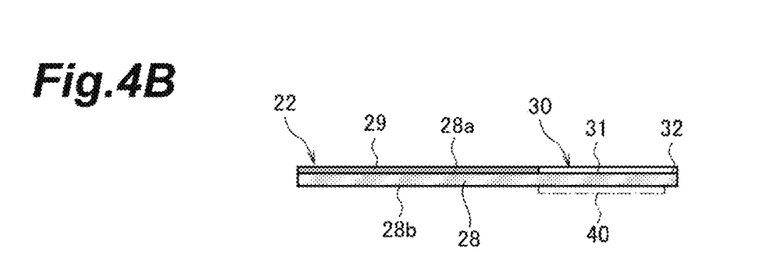
Figure 8B:
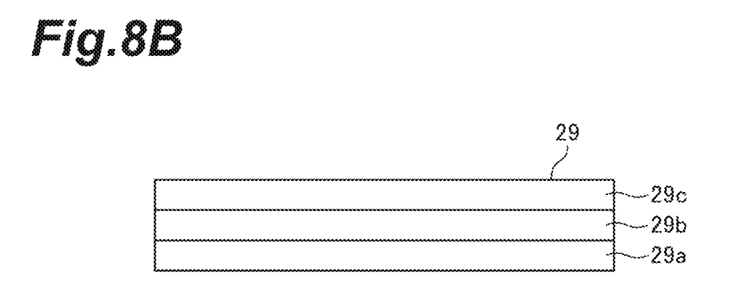
FIG. 8B is a cross-sectional view of a back metal layer.

FIGS. 4A and 4B are diagrams illustrating a ceramic substrate of a first example of the embodiment of the present disclosure. As illustrated in FIGS. 4A and 4B, the second alumina substrate 22 of the amplifier module 1 includes a main substrate 28 and a back metal layer 29 for being mounted on the second metal base 12. The main substrate 28 has a back surface 28a facing the second metal base 12 (See FIGS. 1A and 1B) and a front surface 28b opposite to the back surface 28a. The back metal layer 29 is placed on the back surface 28a the main substrate 28 of the second alumina substrate 22. The back metal layer 29 includes a solid electrode formed of a three-layer metal of a titanium (Ti) layer 29a, a palladium (Pd) layer 29b, and a gold (Au) layer 29c, as illustrated in FIG. 8B and is joined to the second metal base 12 by eutectic solder of gold tin (AuSn). The second metal base 12 and the second alumina substrate 22 can be joined well by this connection.

As illustrated in FIG. 4A, the back surface 28a of the main substrate 28 includes an exposure region 30 at a position corresponding to the die-capacitor 40. The back metal layer 29 is removed in the exposure region 30. The exposure region 30 includes a main region 31 tracing the outer shape of the die-capacitor 40, and an edge region 32 extending from the main region 31 to the edge 22a of the second alumina substrate 22, which is an edge closest to the main region 31. The main region 31 corresponds to the outer shape of the die-capacitor 40 spreading along the front surface 28b (along a surface define by X direction and Y direction) and is formed into a square shape. The edge region 32 is formed into a rectangular shape. The exposure portion 30 including the main region 31 and the edge region 32 is formed into a quadrangular shape of which one side is positioned at the edge of the second alumina substrate 22. In this example, the average stress caused in the die-capacitor was 33.01 (MPa), which is smaller than in the reference example described above. Thus, according to this example of the embodiment, cracking in the die-capacitor 40 of the amplifier 1 can be prevented.

Figure 5:
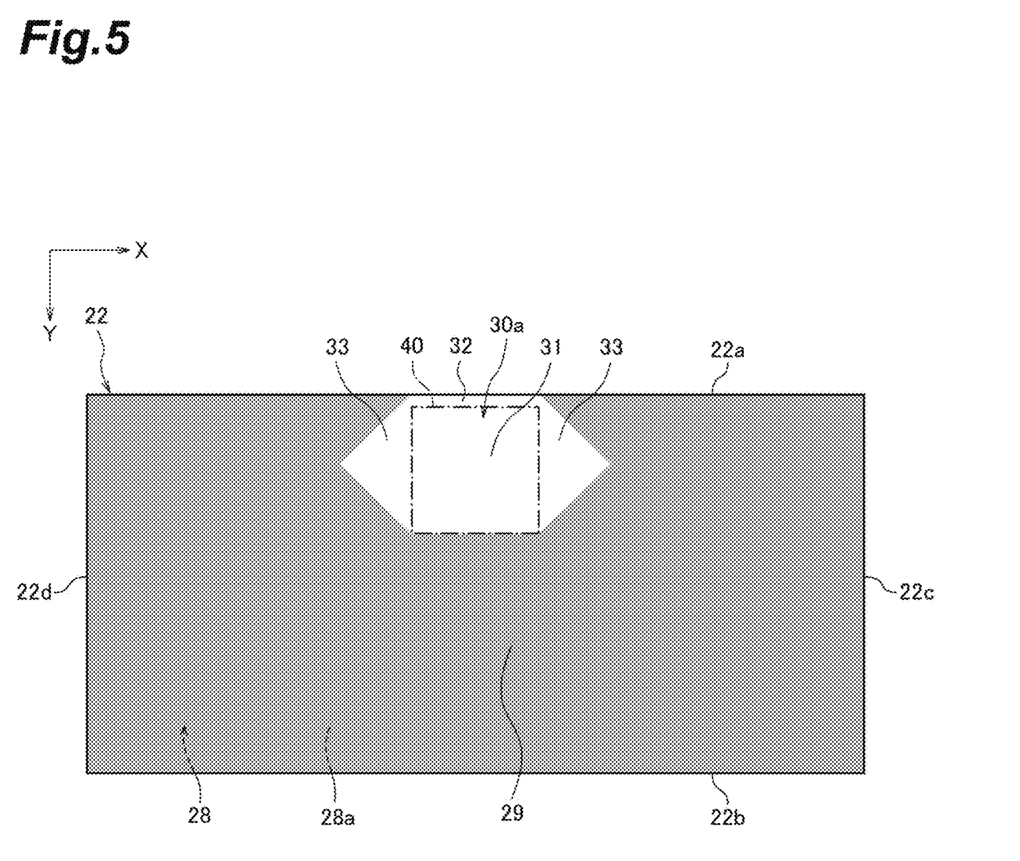
FIG. 5 is a diagram illustrating a ceramic substrate in a second example viewed from a back side thereof.

FIG. 5 is a diagram illustrating a ceramic substrate of a second example of this embodiment of the disclosure. The exposure portion 30a in this example includes a pair of projection regions 33 on the respective sides of the main region 31. Each of the projection regions 33 is formed into an isosceles triangle shape, and includes a base facing a side of the main region 31 and a side of the edge region 32. The projection regions 33 project from the main region 31 toward both edge 22c, 22d and include vertexes located to each other in a direction that is along the edge 22a of the second alumina substrate 22 (X direction in the drawing). The main region 31, the edge region 32, and the projection regions 33 form the exposure region 30a into a hexagonal shape, and the back metal layer 29 is removed on the exposure region 30a. The hexagonal shape is a shape stretched in a direction that is along the edge 22a of the second alumina substrate 22 (X direction in the drawing). In this example, an average stress caused in the die-capacitor 40 was 31.12 (MPa), which is even smaller than in the first example described above. Thus, according to this example of the embodiment, cracking in the die-capacitor 40 of the amplifier 1 can be prevented.

Figure 6:
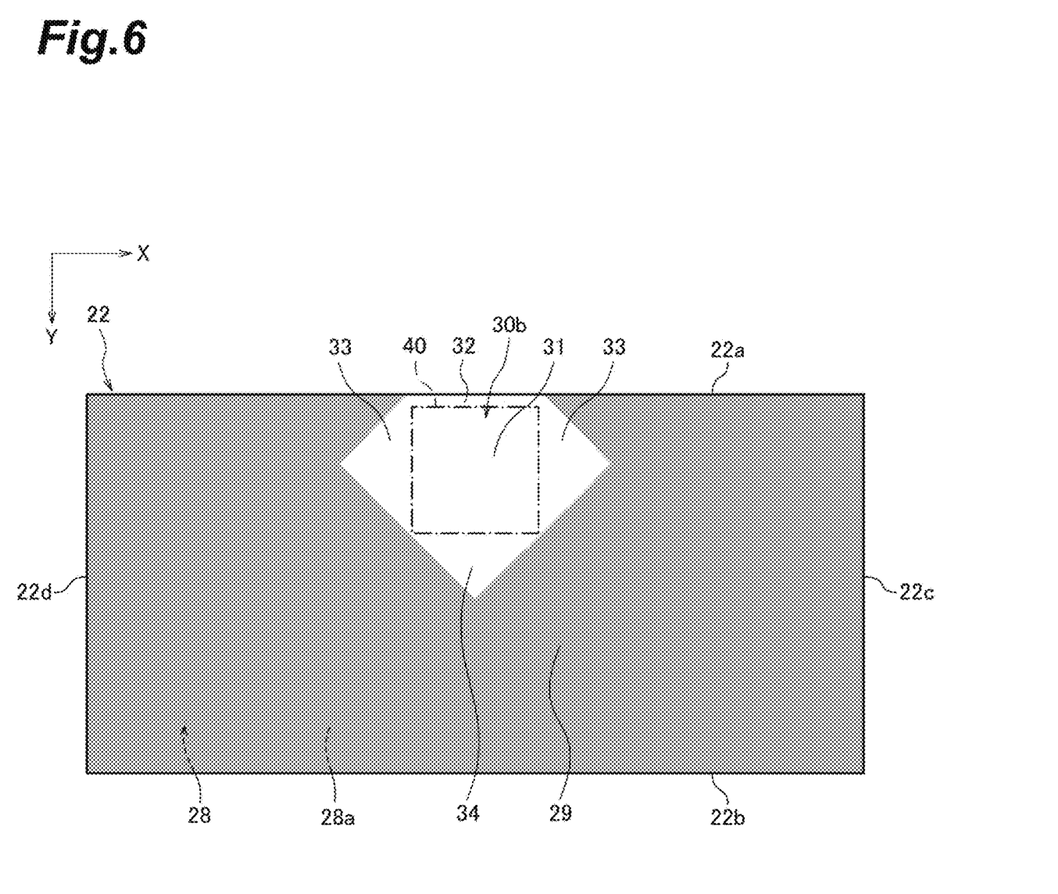
FIG. 6 is a diagram illustrating a ceramic substrate in a third example viewed from a back side thereof.

FIG. 6 is a diagram illustrating a ceramic substrate of a third example of this embodiment of the disclosure. The exposure portion 30b in this example includes a projection region 34 in the back of the main region 31 in addition to the main region 31, the edge region 32, and the projection regions 33 described in the second example. The projection region 34 is formed into an isosceles triangle shape, and includes a base facing a back side of the main region 31 (a side located away from the edge 22a of the second alumina substrate 22). The projection region 34 projects from the main region 31 toward both edges 22c and 22d, and includes a vertex directed to the middle of the second alumina substrate 22. The main region 31, the edge region 32, the projection regions 33, and the projection region 34 form the exposure portion 30b into a shape chamfered at one corner (corner facing the edge 22a of the second alumina substrate 22) of a quadrangular shape. The back metal layer 29 is removed on the exposure portion 30b. The length of each side of the quadrangle corresponds to 42 times the length of each side of the die-capacitor. In this example, the average stress caused in the die-capacitor was 31.95 (MPa), which is smaller than in the first example described above, but is almost equal to the average stress in the case of the second example described above.

Figure 7:
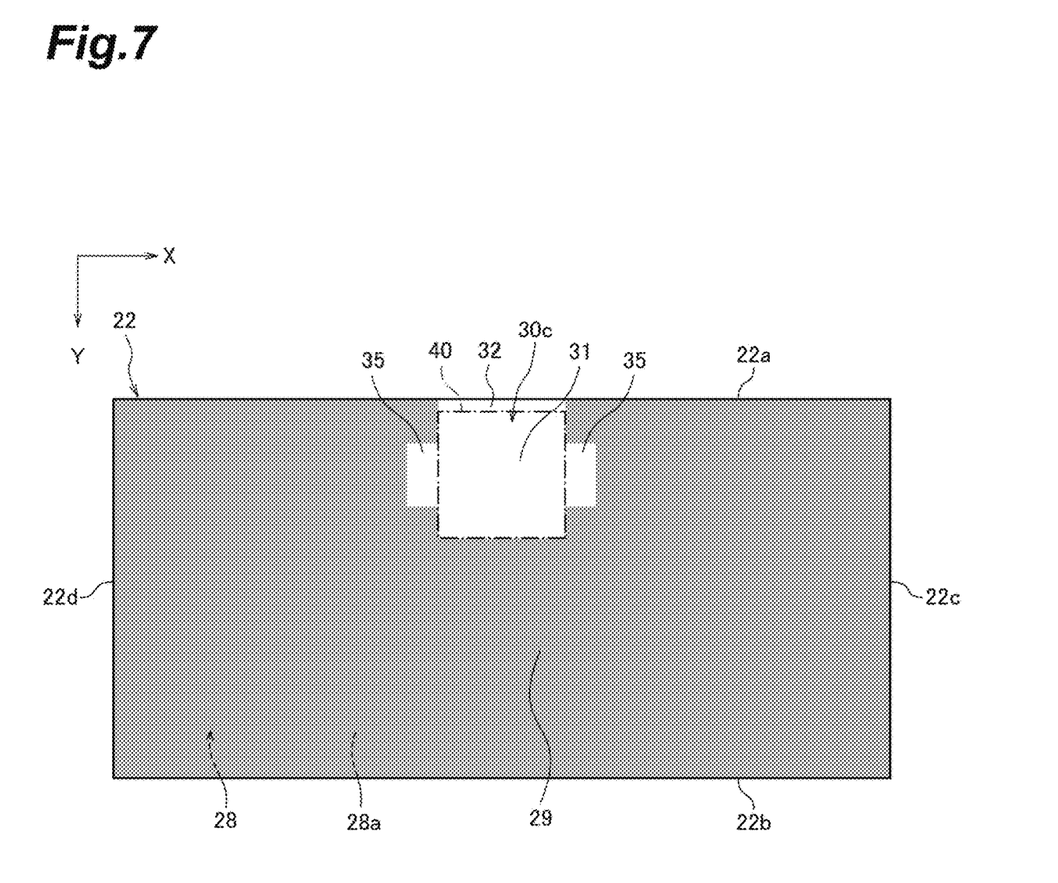
FIG. 7 is a diagram illustrating a ceramic substrate in a fourth example viewed from a back side thereof.

FIG. 7 is a diagram illustrating a ceramic substrate of a fourth example of the embodiment of the disclosure. As in the second example, the exposure portion 30c in this example includes a pair of projection regions 35 on respective sides of the main region 31. The projection region 35 is formed in a rectangular shape and projects toward both edges 22c, 22d. The long side of the projection region 35 faces the side of the main region 31. The middle point of the long side of the projection region 35 and the middle point of the side of the main region 31 coincide with each other. The length of the long side of the rectangle corresponds to ½ of the length of the side of the main region 31. The length of the short side of the rectangle corresponds to ¼ of the length of the side of the main region 31. The main region 31, the edge region 32, and the projection regions 35 form the exposure region 30c into a quadrangular shape with ears, and the back metal layer 29 is removed on the exposure region 30c. In this example, the average stress caused in the die-capacitor was 33.78 (MPa), which is almost equal to the average stress in the first example described above. Thus, according to this example of the embodiment, cracking in the die-capacitor 40 of the amplifier 1 can be prevented.

As in the first to fourth examples, the back metal layer 29 is not provided below the die-capacitor 40 at least in the main region 31 and the edge region 32, and thus the second metal base 12 and the second alumina substrate 22 are not joined in this range. As a result, the electronic module described above alleviates the stress accumulated in the second alumina substrate 22 due to the difference between the linear expansion coefficients of the second metal base 12 and the second alumina substrate 22, and prevents from cracking in the die-capacitor 40.

Further, a large stress is accumulated adjacent to the edge of the second alumina substrate 22 in a direction that is along the edge (X direction in the drawing). Therefore, the stress accumulated in the second alumina substrate 22 is further alleviated when the exposure portions 30, 30a, 30b, 30c are formed so as to be long in the direction along the edge 22a of the second alumina substrate 22 (X direction in the drawing) as in the second and third examples.

It should be noted that the disclosed embodiment and examples are illustrative and non-restrictive in every respect. The scope of the present invention is intended to include not only the meaning described above but also the meaning indicated by the claims and every modification within the meaning and scope equivalent to the claims.

What is claimed is:

1. An electronic module comprising:
    a metal base;
    a first ceramic substrate including a main substrate and a back metal layer, the main substrate having a back surface facing the metal base and a front surface opposite to the back surface, the back metal layer being on the back surface of the main substrate, the first ceramic substrate being mounted on the metal base via an eutectic solder joined with the back metal layer; and
    a die-capacitor mounted on the front surface of the main substrate along one edge of the main substrate,
    wherein the back surface of the main substrate is provided with an exposure region where the back metal layer is not provided, and the exposure region includes a main region corresponding to an outer shape of the die-capacitor spreading along the front surface and an edge region extending from the main region to the one edge of the main substrate,
    wherein the back metal layer has a first portion and a second portion spaced apart from the first portion by the exposure region, and
    wherein the first portion and the second portion are electrically connected.

2. The electronic module according to claim 1, wherein the metal base includes at least one of a copper layer and a molybdenum layer.

3. The electronic module according to claim 1, wherein the metal base includes a first copper layer, a molybdenum layer placed on the first copper layer, and a second copper layer placed on the molybdenum layer, the first and second copper layers sandwiching the molybdenum layer therebetween.

4. The electronic module according to claim 1, wherein the first ceramic substrate includes an alumina substrate.

5. The electronic module according to claim 1, wherein the die-capacitor is mainly formed of barium titanate.

6. The electronic module according to claim 1, wherein the first ceramic substrate has a thickness of 0.4±0.05 (mm), and the die-capacitor is mounted at a distance less than 0.8 (mm) from the one edge of the main substrate to an inside of the ceramic substrate.

7. The electronic module according to claim 1, wherein the back metal layer includes at least one of titanium, palladium and gold, and the eutectic solder includes gold tin.

8. The electronic module according to claim 1, wherein the back metal layer includes a titanium layer, a palladium layer, and a gold layer, and the eutectic solder includes gold tin.

9. The electronic module according to claim 1, wherein the exposure region further includes a projection region that projects from the main region toward another edge of the main substrate, in addition to toward the one edge.

10. The electronic module according to claim 9, wherein the projection region has a triangular shape or a rectangular shape.

11. The electronic module according to claim 1, wherein the main region is formed into a square shape and the edge region is formed into a rectangular shape.

12. The electronic module according to claim 1, wherein the exposure region is formed into a rectangular shape or a hexagonal shape in whole.

13. The electronic module according to claim 1, further comprising:
    a plurality of ceramic substrates including the first ceramic substrate; and
    a field effect transistor mounted on the metal base between the first ceramic substrate and another ceramic substrate of the plurality of ceramic substrates.

14. The electronic module according to claim 1, further comprising a plurality of ceramic substrates each including a main substrate, wherein the one edge of the first ceramic substrate is adjacent to another ceramic substrate placed adjacent to the first ceramic substrate.

15. The electronic module according to claim 1, further comprising:
    a package placed on the metal base and surrounding the first ceramic substrate therein; and
    a lid attached to a top of the package to close an opening of the package.

16. The electronic module according to claim 1, wherein a surface area of the main substrate is smaller than a surface area of the metal base.

17. The electric module according to claim 1, wherein the exposure region is surrounded by the back metal layer on the back surface area of the main substrate.

18. The electric module according to claim 1, wherein the back metal layer is single pattern.

* * * * *